(12) United States Patent
Tang et al.

(10) Patent No.: US 12,647,126 B2
(45) Date of Patent: Jun. 2, 2026

(54) HYBRID AND ADAPTIVE OFFSET CALIBRATION FOR SAR ADC

(71) Applicant: QUALCOMM Incorporated, San Diego, CA (US)

(72) Inventors: Yongjian Tang, San Diego, CA (US); Kenneth Luis Arcudia, Cary, NC (US)

(73) Assignee: QUALCOMM INCORPORATED, San Diego, CA (US)

( * ) Notice: Subject to any disclaimer, the term of this patent is extended or adjusted under 35 U.S.C. 154(b) by 107 days.

(21) Appl. No.: 18/745,693

(22) Filed: Jun. 17, 2024

(65) Prior Publication Data

US 2025/0385685 A1      Dec. 18, 2025

(51) Int. Cl.
| | |
|---|---|
| *H03M 1/12* | (2006.01) |
| *H03M 1/10* | (2006.01) |
| *H03M 1/46* | (2006.01) |

(52) U.S. Cl.
CPC ......... *H03M 1/462* (2013.01); *H03M 1/1023* (2013.01)

(58) Field of Classification Search
CPC .... H03M 1/462; H03M 1/1023; H03M 1/464; H03M 1/38
USPC .......................................... 341/155, 161, 163
See application file for complete search history.

(56) References Cited

U.S. PATENT DOCUMENTS

| | | |
|---|---|---|
| 10,483,995 B1 | 11/2019 | Lok et al. |
| 2007/0132626 A1 | 6/2007 | Hurrell |

| | | | |
|---|---|---|---|
| 2010/0214140 A1 | 8/2010 | Reinhold et al. | |
| 2016/0182075 A1* | 6/2016 | Devarajan ............. | H03M 1/121 341/120 |
| 2019/0131986 A1 | 5/2019 | Mnje et al. | |
| 2022/0286139 A1* | 9/2022 | Park .................... | H03M 1/1028 |
| 2022/0302921 A1* | 9/2022 | Dyer .................... | G06F 18/214 |

FOREIGN PATENT DOCUMENTS

CN            112383307 A       2/2021

OTHER PUBLICATIONS

Chan C-H., et al., "A Voltage-Controlled Capacitance Offset Calibration Technique for High Resolution Dynamic Comparator", SOC Design Conference (ISOCC), 2009 International, IEEE, Piscataway, NJ, USA, Nov. 22, 2009, pp. 392-395, XP031644266, section II, figure 1.
Im J., et al., "A 112-Gb/s PAM-4 Long-Reach Wireline Tranceiver Using a 36-Way Time-Interleaved SAR ADC and Inverter-Based RX Analog Front-End in 7-nm FinFET", IEEE Journal of Solid-state Circuits, IEEE, USA, vol. 56, No. 1, Sep. 25, 2020, Jan. 2021, pp. 7-18, XP011828304, section IV, figure 4.
International Search Report and Written Opinion PCT/US2025/029331 ISA/EPO Sep. 3, 2025.

* cited by examiner

*Primary Examiner* — Peguy Jean Pierre
(74) *Attorney, Agent, or Firm* — Loza & Loza, LLP

(57)                    ABSTRACT

A SAR ADC is provided with a hybrid offset calibration that includes a digital calibration without bit extension. Due to the lack of bit extension, the digital calibration can only address integer multiples of least-significant bits for the offset. The hybrid offset calibration further includes an analog calibration that addresses a remaining fraction of a least-significant bit of the offset.

20 Claims, 7 Drawing Sheets

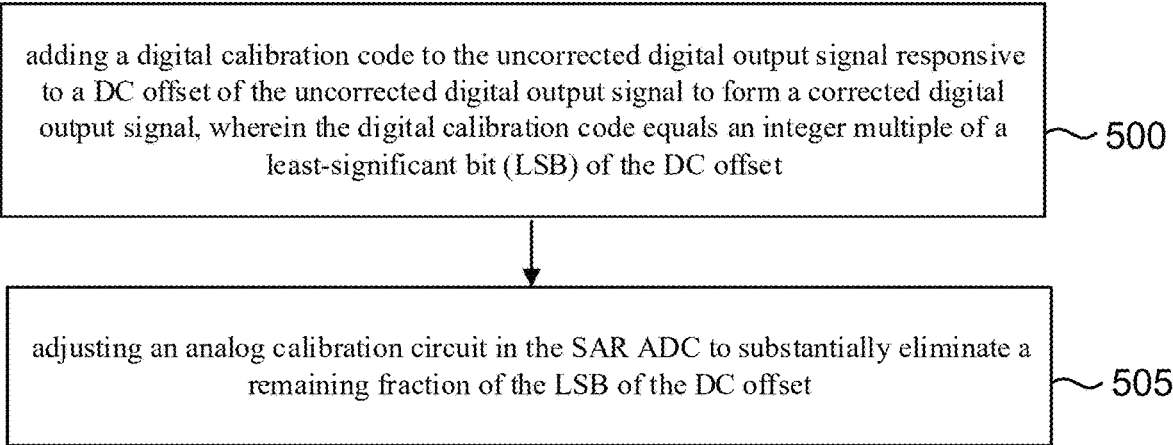

adding a digital calibration code to the uncorrected digital output signal responsive to a DC offset of the uncorrected digital output signal to form a corrected digital output signal, wherein the digital calibration code equals an integer multiple of a least-significant bit (LSB) of the DC offset ⟩~ 500 adjusting an analog calibration circuit in the SAR ADC to substantially eliminate a remaining fraction of the LSB of the DC offset ⟩~ 505

FIG. 5

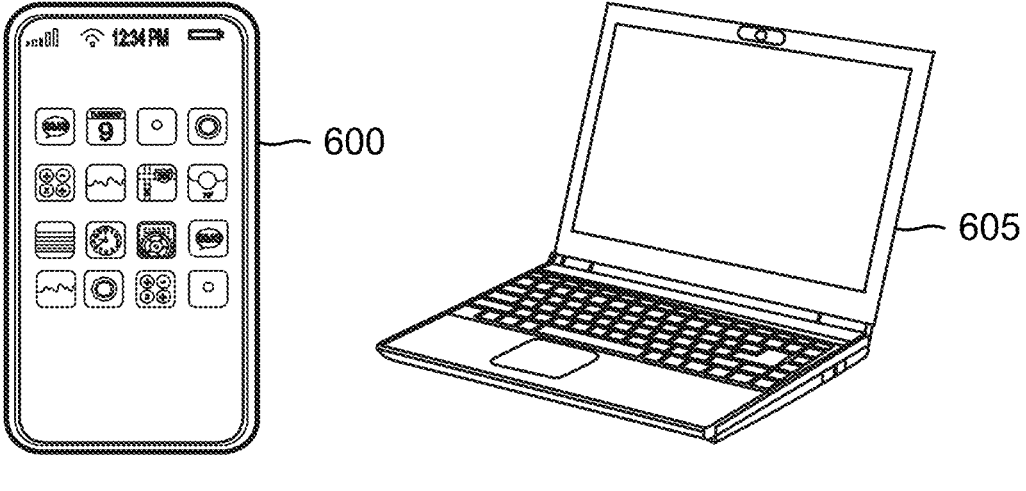
600
605
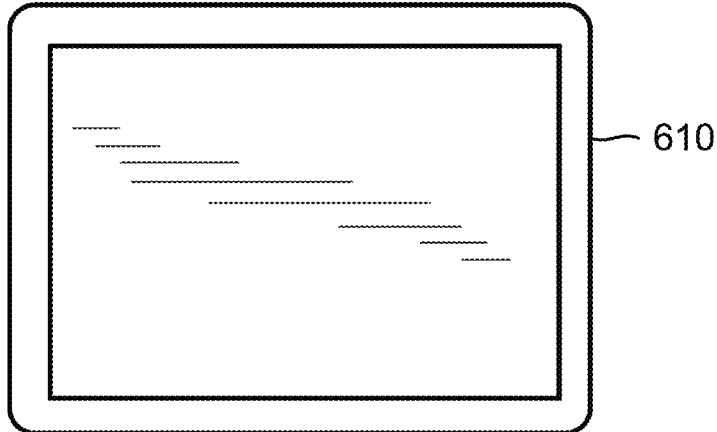
610
FIG. 6

HYBRID AND ADAPTIVE OFFSET CALIBRATION FOR SAR ADC

TECHNICAL FIELD

The present application relates generally to successive approximation register (SAR) analog-to-digital converters (ADCs) and, more specifically, to a hybrid and adaptive offset calibration for SAR ADCs.

BACKGROUND

At higher processing speeds for a central processing unit (CPU), the speed of the CPU/s input/output (I/O) path may become a limiting factor. If the I/O path is formed using a parallel data bus, the timing skew typically becomes unacceptable at relatively high data rates. A serial bus such as implemented using a serializer-deserializer (SerDes) is thus an attractive alternative for a high-speed data processing. But the clock must be recovered from the serial data stream in a SerDes. This recovery becomes more and more difficult as the data rate is increased, making the design of a multi-gigabit SerDes challenging.

To ease the design challenges of achieving multi-gigabit SerDes performance (e.g., 32 or 64 gigabit), multi-level SerDes such as a pulse amplitude modulation 4-level (PAM4) SerDes have been developed in which each symbol in the serial data stream encodes for more than a single bit. The clock data recovery (CDR) in a multi-level SerDes generally requires the use of a successive-approximation-register (SAR) analog-to-digital converter (ADC) based architecture. In a SAR-ADC-based SerDes, equalization techniques such as feedforward equalization (FFE) and decision feedback equalization (DFE) occur in the digital domain. For these equalization techniques to be successful, the analog-to-digital conversion in a SAR-ADC-based SerDes should be as ideal as possible. One factor in the non-ideality of a SAR ADC is the offset of its comparator. The comparator will transition a binary value of its output signal based upon a comparison of its non-inverting input terminal voltage to its inverting input terminal voltage. Ideally, the output signal will transition when these two voltages are equal but in practice there is an offset voltage such that the transition occurs when the non-inverting input terminal voltage equals the non-inverting input terminal voltage plus the offset voltage.

Because of the offset voltage at the comparator, a digital output signal of the SAR ADC will typically have a direct current (DC) offset with respect to what it would equal in the absence of the offset voltage. This DC offset may also be denoted as a residue offset.

The DC offset can be problematic, particularly with respect to the interleaving of SAR ADCs. In that regard, it is difficult to design a single SAR ADC to operate at relatively high speeds such as greater than several gigabits per second. It is thus traditional to interleave SAR ADCs so that a high-speed signal may be digitized. A SAR-ADC-based SerDes receiver will thus typically have a plurality of interleaved SAR ADCs. But each SAR ADC's comparator may have a different DC offset. The varying DC offsets result in undesirable channel mismatch tones that degrade the overall performance of the SAR-ADC-based SerDes receiver.

SUMMARY

In accordance with an aspect of the disclosure, a successive-approximation-register (SAR) analog-to-digital converter (ADC) system is provided that includes: a SAR ADC configured to convert an analog input signal into an uncorrected digital output signal, the SAR ADC including an analog calibration circuit responsive to an analog correction code; a digital adder configured to add a digital calibration code to the uncorrected digital output signal to produce a corrected digital output signal; and a controller configured to adjust the digital calibration code and the analog calibration code responsive to a DC offset in the uncorrected digital output signal.

In accordance with another aspect of the disclosure, a method of calibrating a DC offset of an uncorrected digital output signal of a SAR ADC is provided that includes: adding a digital calibration code to the uncorrected digital output signal responsive to the DC offset of the uncorrected digital output signal to form a corrected digital output signal, wherein the digital calibration code equals an integer multiple of a least-significant bit (LSB) of the DC offset; and adjusting an analog calibration circuit in the SAR ADC to substantially eliminate a remaining fraction of the LSB of the DC offset.

Finally, in accordance with another aspect of the disclosure, a serializer-deserializer receiver is provided that includes: a continuous-time linear equalizer configured to process an input signal to produce a plurality of analog-to-digital converter (ADC) input signals; a plurality of ADC slices corresponding to the plurality of ADC input signals, each ADC slice including a successive-approximation register (SAR) ADC system configured to digitize a corresponding one of the ADC input signals, wherein each SAR ADC system comprises: a SAR ADC configured to convert an analog input signal into an uncorrected digital output signal having a DC offset, the SAR ADC including an analog calibration circuit responsive to an analog correction code; a digital adder configured to add a digital calibration code to the uncorrected digital output signal to produce a corrected digital output signal; and a controller configured to generate the digital calibration code and to generate the analog calibration code responsive to the DC offset.

These and other advantageous features may be better appreciated through the following detailed description.

BRIEF DESCRIPTION OF THE DRAWINGS

FIG. 5 is a flowchart for a method of for a method of performing hybrid and adaptive offset calibration in a SAR ADC in accordance with an aspect of the disclosure.

FIG. 6 illustrates some example electronic systems including a ADC-based SerDes with hybrid and adaptive offset calibration in accordance with an aspect of the disclosure.

Implementations of the present disclosure and their advantages are best understood by referring to the detailed description that follows. It should be appreciated that like reference numerals are used to identify like elements illustrated in one or more of the figures.

DETAILED DESCRIPTION

Figure 1:
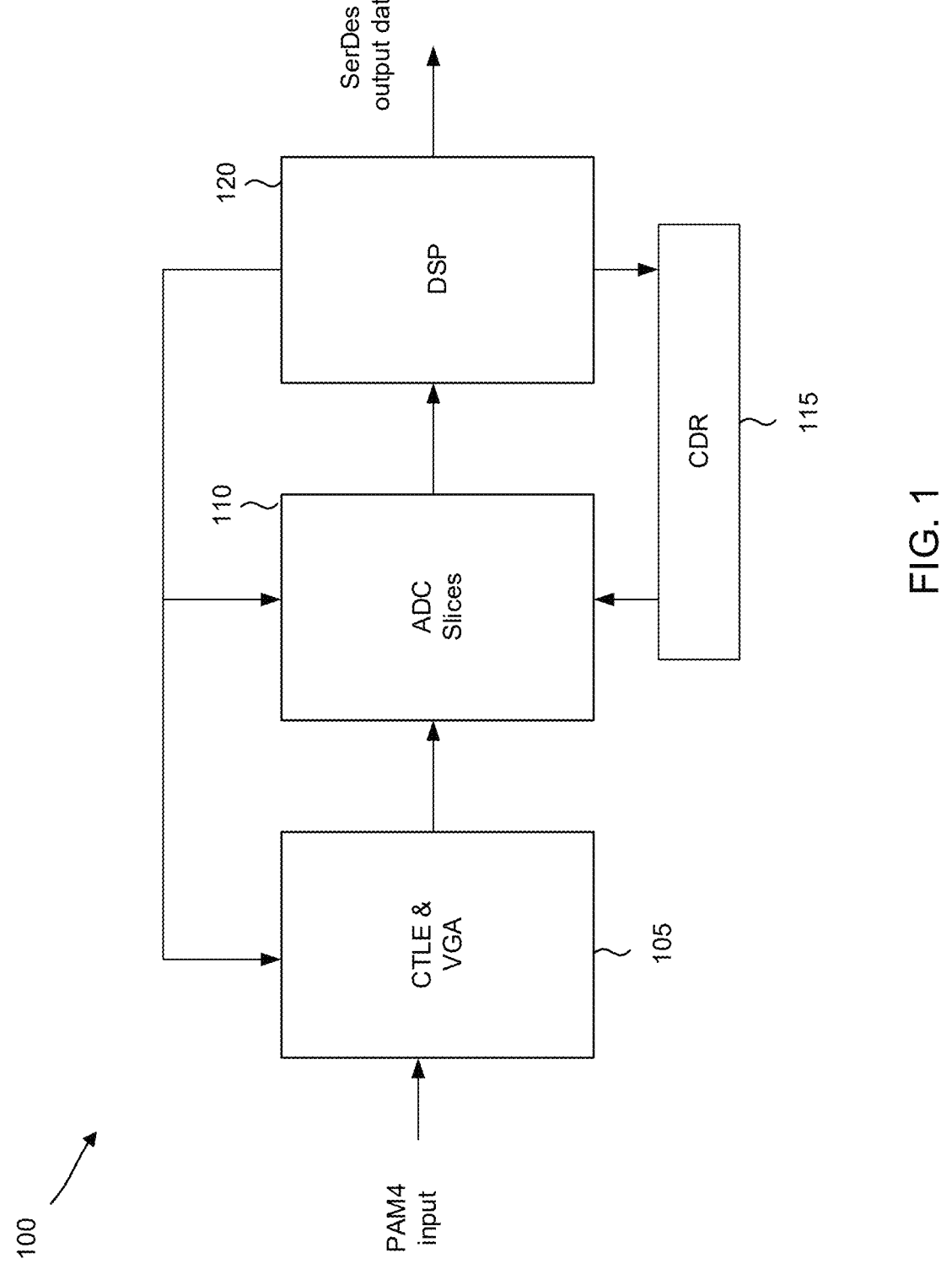
FIG. 1 illustrates a SerDes including a SAR ADC stage that practices hybrid and adaptive offset calibration in accordance with an aspect of the disclosure.

An ADC-based SerDes receiver using multiple interleaved ADCs is a known architecture to achieve multigigabit (e.g., 32 or 64 gigabits) performance. Each ADC may be deemed to be implemented in a "slice." The ADC slices are time interleaved. This time interleaving achieves high data rates yet relaxes the requirements for each ADC slice. For a variety of reasons, the ADC in each ADC slice is typically implemented as a successive-approximation register (SAR) ADC. The SerDes receiver then performs digital equalization such as DFE and FFE on a combined digital output signal from the SAR ADC slices. The success of these linearization techniques depends on the ideality of each SAR ADC slice. One factor in the non-ideality of a SAR ADC is the presence of a voltage offset in the SAR ADC's comparator. The comparator compares an input signal sample to a feedback signal from a digital-to-analog converter (DAC) such as a capacitive DAC (CDAC). An output signal from the comparator should transition just as the feedback signal becomes greater than the input signal sample. But because of the voltage offset, the comparator output signal may instead transition when the feedback signal equals the input signal plus the voltage offset (note that the voltage offset may be positive or negative). Due to this voltage offset at the comparator and other non-idealities, a digital output signal from the SAR ADC may have a direct current (DC) offset. In that regard, suppose that the analog input signal to the SAR ADC has no DC offset. A time-averaged (low-pass filtered) value of the digital output signal from the SAR ADC should in turn not have a DC offset. But the voltage offset at the comparator results in a DC offset in the time-averaged value of the digital output signal.

The DC offset will tend to vary from one SAR ADC slice to another in a SAR-ADC-based SerDes receiver. The various DC offsets adversely affect the SerDes receiver performance. One approach to address the DC offset is digital calibration. In digital calibration, a digital calibration loop detects a bit offset in the SAR ADC's digital output signal that result from the comparator's DC offset. For example, suppose the digital calibration loop detects that an uncorrected digital output signal is too high by some number of bits. The digital calibration loop can then compensate for this output signal offset by subtracting it from the uncorrected digital output signal to provide a corrected digital output signal. Conversely, should the uncorrected digital output signal be too low, the corrected digital output signal would be greater than the uncorrected digital output signal. To achieve sub least-significant bit (LSB) resolution in this digital calibration requires bit extension. For example, suppose that the uncorrected digital output signal has a seven-bit resolution (the uncorrected digital output signal being represented by a seven-bit digital word). Because of the bit extension, the digital calibration loop requires an even higher resolution (e.g., 10 bits) to achieve a sub-LSB resolution. The resulting bit extension consumes substantial power.

An alternative to digital calibration is analog calibration. The offset in the digital output signal is again detected as in digital calibration but in analog calibration the offset is used in a feedback loop to adjust an analog calibration circuit in the SAR ADC. For example, the analog calibration circuit may be implemented by loading each input terminal of the comparator with one or more variable capacitors. Depending upon the offset, the feedback loop varies the capacitance of the variable capacitors until the offset is sufficiently reduced. Analog calibration does not require bit extension and may have relatively fine resolution. However, note that the tuning circuit needs to address the entire expected offset range, which may be relatively large. The operation of the tuning circuit may thus slow down the ADC performance and consume power.

An improved SAR ADC is disclosed with hybrid calibration that does not need the tuning range of analog calibration nor does it need bit extension. The hybrid calibration includes a digital calibration loop that functions without bit extension for low power consumption. Due to the lack of bit extension, the residue offset (error in the corrected output signal of the SAR ADC) will be within +/−0.5 LSB. The hybrid calibration thus includes an analog calibration loop to further reduce the residue offset. But since the residue offset is bounded by the digital calibration loop, the analog calibration loop may have a reduced offset tuning range such as only +/−0.5 LSB. With this reduced range, the analog calibration loop's impact to the SAR ADC's speed and power consumption is relatively minor. The resolution of the analog calibration loop may be as fine as desired.

The advantageous SAR ADC with hybrid offset calibration disclosed herein may be used to implement the ADC in each slice in a SerDes receiver (e.g., a multi-level SerDes receiver). However, it will be appreciated that the hybrid offset calibration may be applied to any suitable SAR ADC, regardless of whether the SAR ADC is included within a SerDes receiver. An example SAR-ADC-based SerDes receiver 100 with hybrid offset calibration is shown in FIG. 1. A continuous time linear equalizer (CTLE) and variable gain amplifier (VGA) 105 processes a PAM4 input signal to provide an analog input signal to the ADC slices 110. A digital signal processor (DSP) 120 processes a combined ADC output signal from the ADC slices 110 with digital equalization techniques such as FFE and DFE to form the SerDes output data. A clock data recovery circuit 115 recovers a clock signal from the SerDes output data to control the ADC slices 110 accordingly.

Figure 2:
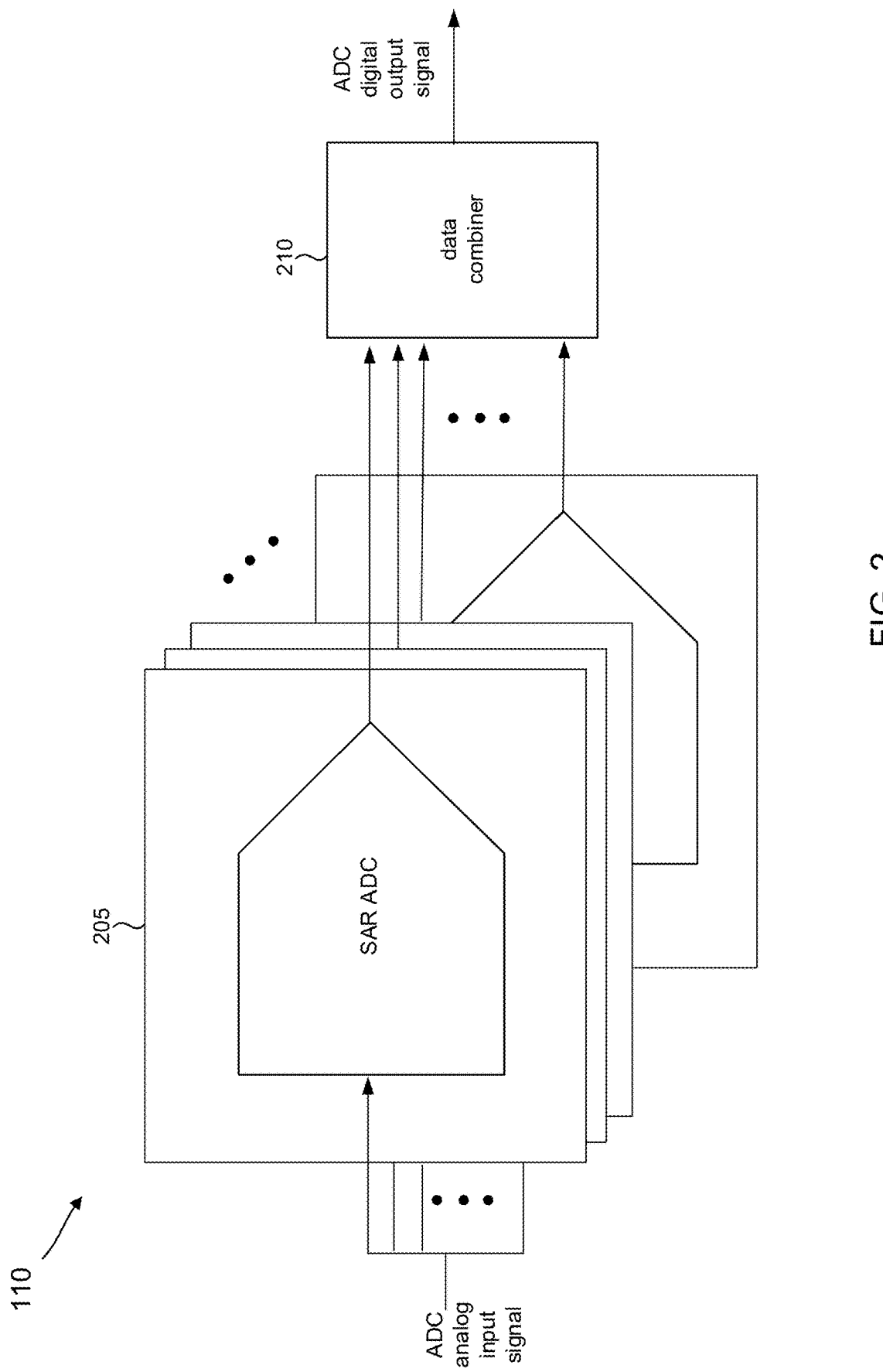
FIG. 2 illustrates the interleaving of SAR ADC slices in the SAR ADC stage of FIG. 1 in which each SAR ADC slice practices hybrid and adaptive offset calibration in accordance with an aspect of the disclosure.

An implementation of the ADC slices 110 is shown in more detail in FIG. 2. A plurality of SAR ADC slices 205 are time interleaved in parallel to process an ADC analog input signal. In one implementation, there are sixty-four SAR ADC slices 205 but it will be appreciated that a larger or smaller number of SAR ADC slices 205 may be used in alternative implementations. A data combiner 210 combines the data output signals from each of the SAR ADC slices 205 to form an ADC digital output signal. Because of the parallel processing by the SAR ADC slices 205, a relatively high data rate may be achieved for the ADC digital output signal yet each SAR ADC slice 205 may operate at a significantly lower data rate.

Figure 3A:
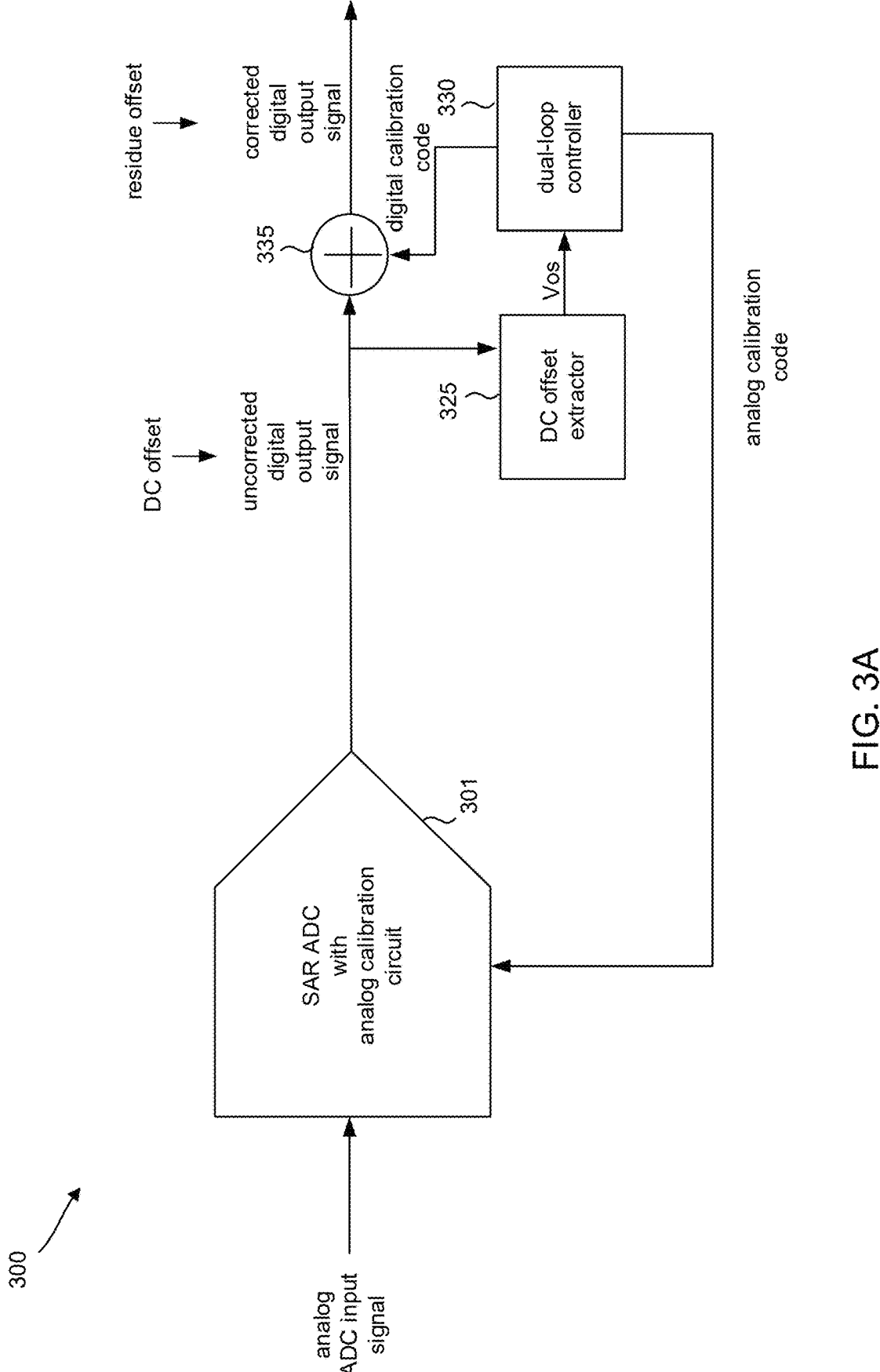
FIG. 3A illustrates a SAR ADC system that practices hybrid and adaptive offset calibration in accordance with an aspect of the disclosure.

But the advantages of the parallel processing are diminished if the DC offset in each SAR ADC 205 is not addressed. The hybrid offset calibration disclosed herein substantially reduces or even eliminates the DC offset. An example SAR ADC system 300 with hybrid offset calibration is shown in FIG. 3A that may form the SAR ADC in each SAR ADC slice 205 of FIG. 2. A SAR ADC 301 in the SAR ADC system 300 includes an analog calibration circuit (not shown in FIG. 3A) that functions to convert an analog ADC input signal into an uncorrected digital output signal having a DC offset. As will be explained further with respect to FIG. 3B, the analog calibration circuit is responsive to an analog calibration code.

A DC offset extractor 325 may detect the DC offset (Vos) such as through a low-pass filtering of the uncorrected digital output signal. Based upon the DC offset, a controller 330 calculates a digital calibration code that addresses the DC offset without bit extension. Because there is no bit extension, the digital calibration code is an integer multiple (0, 1, 2, etc.) of the LSB for DC offset. For example, suppose that the DC offset prior to analog and digital calibration is 3.4 LSB. In that case, the uncorrected digital output signal from the SAR ADC 301 is too high by 3.4 LSB. Since there is no bit extension, the digital calibration code would be negative 3 LSBs in that case. A digital adder 335 adds the digital calibration code to the uncorrected digital output signal to produce a corrected digital output signal for the SAR ADC system 300. But a residue offset will remain in the corrected digital output signal due to the lack of bit extension in the calculation of the digital calibration code. The residue offset thus equals the offset remaining in the corrected digital output signal.

To address the residue offset that would otherwise remain in the corrected digital output signal due to the lack of bit extension for the digital calibration, the controller 300 also generates the analog calibration code for controlling the analog calibration of the SAR ADC 301. There are numerous ways that the SAR ADC 301 may be integrated with an analog calibration circuit. An example implementation of the SAR ADC 301 is shown in more detail in FIG. 3B. A sample-and-hold circuit 305 samples the analog ADC input signal, holds and amplifies the sample, and provides the sample to a comparator 310 for processing. A digital-to-analog converter (DAC) such as a capacitor DAC (CDAC) 320 converts the corrected digital output signal into an analog feedback signal received at a non-inverting input terminal of the comparator 310. The comparator 310 receives the current input sample from the sample-and-hold circuit 305 at its non-inverting input terminal although it is arbitrary which input terminal receives the input sample versus the feedback signal. In this implementation, comparator 310 is a differential comparator that reverses the binary state for a complementary pair of output signals Vout+ and Vout− based upon the comparison of the analog feedback signal and the input sample. However, it will be appreciated that comparator 310 may have a single-ended output signal in alternative implementations. The input signal sample and the analog feedback signal may be differential or single-ended in alternative implementations.

The Vout+ signal is produced at a first output terminal such a positive output terminal of the comparator 310. Similarly, the Vout− signal is produced at a second output terminal such as a negative output terminal of the comparator 310. The Vout+ and Vout− signals are complementary so that one of them is charged to a power supply voltage whereas the other is grounded depending upon whether the analog feedback signal is greater than or less than the input signal sample. If the comparator 310 is ideal, the Vout+ and Vout− signals will each have a binary transition when the analog feedback signal exceeds the current input sample. But due to the non-ideality in the comparator 310, this transition may not occur when desired. A SAR logic circuit 315 controls the CDAC 320 so that current input sample is converted into the uncorrected digital output signal. This control occurs in a successive approximation fashion. For example, the SAR logic circuit 315 may control the CDAC 320 to first determine the most significant bit of the uncorrected digital output signal. This successive approximation control of the CDAC 320 continues for the next-most-significant bit and so on until all the bits are determined in the uncorrected digital output signal.

Because of the offset for the comparator 310 (and other non-idealities), the uncorrected digital output signal will have a DC offset. This DC offset may have a relatively wide range. But an offset range that an analog calibration circuit 340 may address for the comparator 310 is less than range of the DC offset. Although the resulting analog calibration can only partially correct for the DC offset, the DC offset is substantially eliminated due to the combination of the analog calibration with the digital calibration. In one implementation, the analog calibration circuit 340 may include at least one variable capacitor C1 coupled between the positive output terminal of the comparator 310 and ground. Similarly, the analog calibration circuit 340 may also include at least one variable capacitor C2 coupled between the negative output terminal of the comparator 310 and ground. By adjusting the analog calibration code, the controller 330 (FIG. 3A) adjusts the relative capacitance between the variable capacitors C1 and C2 so that the offset residue is reduced to zero or is reduced to an acceptable level. It may thus be appreciated that the controller 330 is a dual-loop controller as it controls not only the digital calibration but also the analog calibration within the SAR ADC 301. The resulting hybrid (both analog and digital) calibration is quite advantageous because the digital calibration does not require the power consumption of bit extension. Similarly, the calibration range of the analog calibration circuit 340 need not cover the entire expected DC offset range but instead may simply cover the +/−0.5 LSB residue offset that remains after the digital calibration. The operation of the analog calibration circuit 340 is thus relatively low power as well and is also relatively fast as compared to an analog calibration that must address the entire expected DC offset range. The offset calibration is not only a hybrid offset calibration but it is also an adaptive offset calibration as will be explained further herein.

Although the resulting hybrid offset calibration is advantageous, note that its implementation is subject to multiple challenges. For example, due to process, voltage, and temperature variations, the controller 330 does not know the correlation between the analog calibration code and the resulting reduction in the offset residue. What the controller 330 can do is to increase or decrease the analog calibration code until the offset residue is eliminated or reduced to an acceptable level. But the specific correlation between a unit increment/decrement in the analog calibration code and the resulting change in the offset residue is subject to process, voltage, and temperature variations such that it will typically be varying from one moment to the next.

This lack of knowledge complicates the analog calibration code setting when the digital calibration code is either incremented or decremented. The maximum and minimum values of the analog calibration code depend upon the analog calibration range. Although this exact range is unknown due to the process, voltage, and temperature (PVT) variations, suppose that for a nominal PVT setting the maximum value of the analog calibration code corresponds to 0.5 LSB offset correction whereas the minimum value corresponds to −0.5 LSB offset correction. Should the residue offset decrease below −0.5 LSB in such an implementation, the dual-loop controller 330 cannot provide additional analog offset calibration since the analog calibration code would already be at its maximum value. In that case, the digital calibration code would be incremented by one LSB. For example, suppose that the DC offset is −3.6 LSBs and that the digital calibration code is three LSBs and that the analog calibration code corresponds to 0.5 LSB. The analog calibration code cannot be increased any more so the digital calibration code would be incremented to four LSBs. As already noted, the dual-loop controller 330 does not know the correlation between the analog calibration code and the resulting correction to the residue offset. One solution would thus be to set the analog calibration code to its midpoint (the value that results in zero DC offset correction) whenever the digital calibration code is incremented or decremented. But recall that the DC offset was −3.6 LSBs. With the digital calibration code incremented to 4 LSBs, the residue offset then equals 0.4 LSB. The incrementing of the digital calibration code thus results in a relatively large burst error in the residue offset.

An analogous burst error occurs in the residue offset should the digital calibration code be decremented by one LSB. For example, suppose that the DC offset is 3.5 LSBs. The dual-loop controller 330 would thus set the digital calibration code to −3 LSBs and would adjust the analog calibration code to its minimum value to provide a negative 0.5 LSB in offset such that the residue offset is zero. But suppose further that the DC offset increases to equal 3.6 LSBs. The analog calibration code cannot be further decreased so the digital calibration code would be decremented to −4 LSBs. At the same time, the analog calibration code would be set to its midpoint to provide zero DC offset. But with zero offset from the analog calibration and −4 LSBs from the digital calibration and the DC offset equaling 3.6 LSBs, the residue offset would equal negative 0.4 LSB. It may thus be seen that whenever the digital calibration code is incremented or decremented, a relatively large burst error may result in the residue offset.

A loop adaptation is disclosed herein that advantageously addresses this burst error that would otherwise result. In this loop adaptation, the allowable analog calibration range is limited to be +/−(0.5 LSB−Vtarget), where Vtarget (Vtgt) is a targeted post-calibration offset value that bounds the burst error. The targeted post-calibration offset value (Vtgt) is also denoted herein as a desired limit for the residue offset of the corrected digital output signal because the loop adaptation controls the residue offset so that an absolute value of the residue offset generally does not exceed Vtgt. For example, suppose that the burst error is to be bounded by 0.125 LSB. In that case, Vtgt equals 0.125 LSB. More generally, Vtgt equals some value less than 0.5 LSB. The analog calibration range will thus range from a minimum value of −(0.5 LSB−Vtgt) to a maximum value of (0.5 LSB+Vtgt). Should the residue offset fall below-Vtgt with the analog calibration at its maximum value, the digital code would be incremented by one LSB. Following the incrementing of the digital calibration code, the controller 330 switches or flips the analog calibration code from its maximum value to its minimum value. Conversely, the controller 330 decrements the digital calibration code by one LSB should the residue offset exceed Vtgt with the analog calibration at its minimum value. Following the decrementing of the digital calibration code, the controller 330 switches or flips the analog calibration code from its minimum value to its maximum value.

Some examples will now be discussed to show how the residue offset is always cabined by the targeted post-calibration offset value (Vtgt) in the disclosed loop adaptation. For example, suppose that Vtgt equals 0.125 LSB such that the minimum value of offset from the analog calibration corresponds to −(0.5 LSB−0.125 LSB)=−0.375 LSB and that the maximum value of the offset from the analog calibration corresponds to (0.5 LSB−0.125 LSB)=0.375 LSB. As will be explained further herein, the controller 330 can sweep the analog calibration code to determine a maximum allowed value that results in the offset of 0.375 LSB and also to determine a minimum allowed value that results in the offset of −0.375 LSB. Suppose further that the DC offset equals −3.375 LSB such that the digital calibration code equals 3 LSB and the analog calibration code results in the maximum-allowed value of 0.375 LSB. Should DC offset fall from −3.375 LSB to −3.5 LSB, the offset residue then falls from zero to equal −0.125 LSB (−Vtgt in this example). In response, the controller 330 would increment the digital calibration code to equal 4 LSB and switch the analog calibration code to its minimum value so that the offset from the analog calibration equals −0.375 LSB. The residue offset at the incrementing of the digital code thus equals −3.50 LSB+4 LSB−0.375 LSB=0.125 LSB=Vtgt. Conversely, suppose that the DC offset equals 3.375 LSB such that the digital calibration code equals −3 LSB and the analog calibration code results in the minimum-allowed value of −0.375 LSB. Should the DC offset then increase to 3.5 LSB, the residue offset would rise from zero to 0.125 LSB. In response, the controller 330 decrements the digital calibration code to −4 LSB and sets the analog calibration code to produce the maximum-allowed value of 0.375 LSB. The resulting residue offset then equals −4 LSB+3.5 LSB+0.375 LSB=−0.125 LSB=−Vtgt. It may thus be seen that the loop adaptation maintains the burst error in the residue offset at the incrementing/decrementing of the digital calibration code to be no less than −Vtgt and no greater than Vtgt.

Note that in the loop adaptation just discussed, it is assumed that the controller 330 can adjust the analog calibration code to either produce an offset of either (0.5 LSB−Vtgt) or −(0.5 LSB−Vtgt). The reality is that due to PVT variations, the relationship between the analog calibration code and the resulting offset is unknown. The controller 330 may account for this unknown relationship by adjusting the limits on the analog calibration code. In that regard, the analog calibration code has some width in bits. For example, suppose that the analog calibration code is N bits wide, where N is a positive integer. Given this width, the analog calibration code has $2^N$ possible values ranging from a minimum value to a maximum value. In an initial range adaptation, the controller 330 may determine a value of the analog calibration code that results in an offset of (0.5 LSB−Vtgt) by increasing the analog calibration code from its midpoint to a value that results in the residue offset of (0.5 LSB−Vtgt). This value then becomes the upper limit (which may also be denoted as a maximum-allowed value) for the analog calibration code. Similarly, the controller 330 may determine the value of the analog calibration code that results in an offset of −(0.5 LSB−Vtgt) by decreasing the analog calibration code from its midpoint to the value that results in the residue offset of −(0.5 LSB−Vtgt). This value then becomes the lower limit for the analog calibration code.

In an alternative implementation, it may be assumed that the lower limit is spaced below the midpoint of the analog calibration code an equal amount as is the upper limit spaced above the midpoint. In such an implementation, the controller 330 may increase the analog calibration code from its midpoint to a value that results in the residue offset equaling (0.5 LSB−Vtgt). This value may be denoted as the analog limit or as the upper limit. With respect to the midpoint, the lower limit in such an implementation equals the negative of analog limit.

Figure 3B:
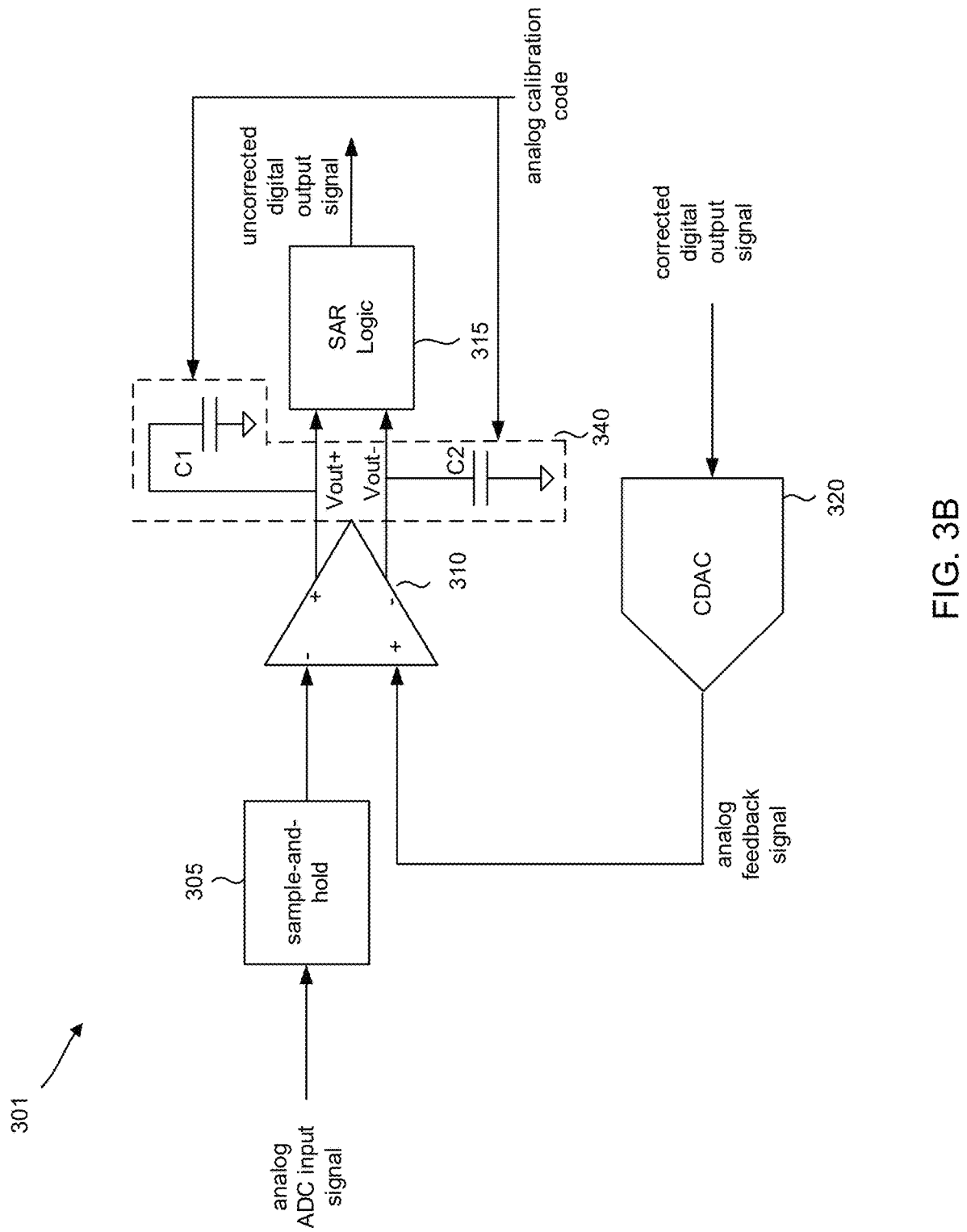
FIG. 3B illustrates a SAR ADC including an analog calibration circuit for the SAR ADC system of FIG. 3A in accordance with an aspect of the disclosure.
Figure 4:
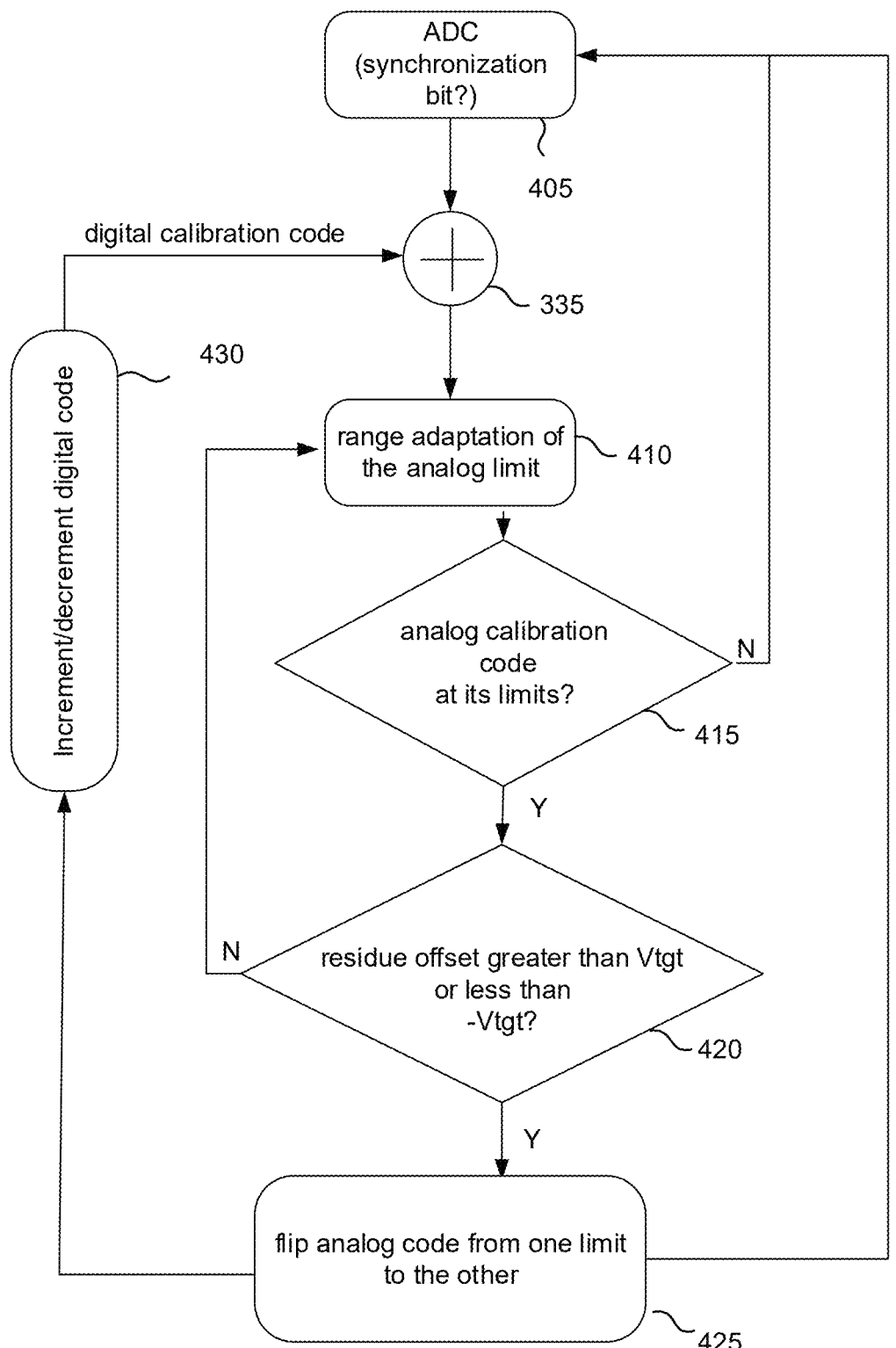
FIG. 4 is a flowchart for a method of performing hybrid and adaptive offset calibration in a SAR ADC in accordance with an aspect of the disclosure.

Regardless of how the upper and lower limits are determined, loop adaptation and range adaptation may then ensue. An example method of operation for the ADC SAR system 300 is shown in the flowchart of FIG. 4. In a step 405, the uncorrected digital output signal from the ADC system 300 is produced and received at the digital adder 335. As discussed with regard to FIG. 3B, the digital adder 335 adds the uncorrected digital output signal with the digital calibration code to form the corrected digital output signal. The controller 330 may then perform a range adaptation of the analog limit discussed previously. With regard to this range adaptation, note that the goal of the loop adaptation is to cabin the residue offset to not be less than −Vtgt nor greater than Vtgt. This loop adaptation assumes that the uncorrected digital output signal is offset by (0.5 LSB−Vtgt) when the analog calibration code is set to the analog limit. As discussed earlier, the controller 330 may sweep the analog calibration code from its midpoint to determine the analog limit as the value of the analog calibration code that results in an offset in the uncorrected digital output signal of (0.5 LSB−Vtgt). But due to voltage and temperature variations after some time has elapsed from this earlier determination, subsequently setting the analog calibration code to the analog limit may or may not result in the offset equaling (0.5 LSB−Vtgt). Conversely, setting the analog calibration code to the negative of the analog limit may not result in the residue offset equaling the negative of (0.5 LSB−Vtgt). The range adaptation of the analog limit in a step 410 either increases or decreases the analog limit so that it may be assured that despite voltage and temperature variations, setting the analog calibration code to the analog limit results in the offset from the analog calibration equaling (0.5 LSB−Vtgt). This incrementing or decrementing of the analog limit depends upon whether the residue offset is less than −Vtgt or greater than Vtgt and also depends upon whether the digital calibration code had last been incremented or decremented by one LSB.

Due to the range adaptation, the hybrid offset calibration disclosed herein may also be denoted as a hybrid and adaptive offset calibration. With the range adaptation completed, the controller 330 determines in a step 415 whether the analog calibration code has been increased to the analog limit or decreased to the negative of the analog limit. If this determination is negative (N), the analog calibration loop continues as indicated by the process starting over at step 405. If the determination in step 415 is positive (Y) such that the analog calibration code has been increased to reach its upper limit (also denoted herein as the analog limit) or decreased to reach its lower limit (also denoted herein as the negative of the analog limit), the controller 330 determines in a step 420 whether the residue offset is greater than Vtgt or less than-Vtgt. Should this determination be negative (N), the analog calibration loop continues by returning back to step 410. If the determination in step 420 is positive (Y), the loop adaptation of flipping the analog calibration code from either the upper limit to the lower limit or vice versa occurs in a step 425. In addition, a synchronization timing bit is asserted in step 405 responsive to the loop adaptation (the flipping of the analog calibration code) occurring in step 425. As defined herein, a binary signal such as the synchronization timing bit is deemed to be asserted when the signal has a binary true value, regardless of whether this binary true value is represented through an active-high or an active-low binary convention.

The setting of the synchronization timing bit is quite advantageous with respect to coordinating the loop adaptation of the analog calibration code in step 425 with a subsequent incrementing or decrementing of the digital calibration code by one LSB in a step 430. The loop adaptation of the analog calibration code in conjunction with the incrementing/decrementing of the digital calibration code will keep an absolute value of the burst error in the residue offset from exceeding Vtgt as discussed earlier. But this assumes that the loop adaptation of the analog calibration code and the incrementing/decrementing of the digital calibration code are simultaneous with respect to the same uncorrected digital output signal. In that regard, as the SAR ADC 301 processes the analog input signal, it will periodically update the uncorrected digital output signal according to the input signal data rate. The uncorrected digital output signal may thus be deemed to vary from one sample to another responsive to this input signal data rate. To ensure that the adjustment of the digital calibration code and the loop adaptation of the analog calibration code affect the same uncorrected digital output signal sample, the production of the uncorrected digital output signal in step 405 asserts the synchronization timing bit when this production is responsive to the newly flipped analog calibration code. By waiting to increment or decrement the digital calibration code in step 430 until the synchronization timing bit is set, the controller 330 may be assured that the digital calibration loop (the processing through step 430 and the subsequent addition at adder 335) and the analog calibration loop are properly synchronized. Although the resulting use of the synchronization timing bit is quite advantageous, it will be appreciated that this synchronization may occur through other timing techniques that don't involve the setting of a synchronization timing bit.

An example method of operation for a hybrid offset calibration will now be discussed with respect to the flowchart of FIG. 5. The method includes an act 500 of adding a digital calibration code to the uncorrected digital output signal responsive to a DC offset of the uncorrected digital output signal to form a corrected digital output signal, wherein the digital calibration code equals an integer multiple of a least-significant bit (LSB) of the DC offset. The addition at adder 335 of FIG. 3B and FIG. 4 is an example of act 500. The method also includes an act 505 of adjusting an analog calibration circuit in the SAR ADC to substantially eliminate a remaining fraction of the LSB of the DC offset. The adjustment of the analog calibration circuit 340 by the controller 330 is an example of act 505.

A SerDes receiver including a SAR ADC with hybrid offset calibration as disclosed herein may be incorporated in a wide variety of electronic systems. For example, as shown in FIG. 6, a cellular telephone 600, a laptop computer 605, and a tablet 610 may all include a SerDes receiver in accordance with the disclosure. Other exemplary electronic systems such as a video player, a communication device, and a personal computer may also be configured with a SerDes receiver constructed in accordance with the disclosure.

Some example implementations are described by the following numbered clauses:

Clause 1. A successive-approximation-register (SAR) analog-to-digital converter (ADC) system, comprising:
    a SAR ADC configured to convert an analog input signal into an uncorrected digital output signal, the SAR ADC including an analog calibration circuit responsive to an analog correction code;
    a digital adder configured to add a digital calibration code to the uncorrected digital output signal to produce a corrected digital output signal; and a controller configured to adjust the digital calibration code and the analog calibration code responsive to a DC offset in the uncorrected digital output signal.

Clause 2. The successive-approximation-register (SAR) analog-to-digital converter (ADC) system of clause 1, wherein the controller is further configured to adjust the analog calibration code to not exceed an upper limit and to not be less than a lower limit.

Clause 3. The successive-approximation-register (SAR) analog-to-digital converter (ADC) system of clause 2, wherein analog calibration circuit is configured to produce an offset in the uncorrected digital output signal equaling a difference between one half of a least-significant bit (0.5 LSB) and a desired limit (Vtarget) for a residue offset of the corrected digital output signal in response to the analog calibration code equaling the upper limit, and wherein the analog calibration circuit is further configured to produce an offset in the uncorrected digital output signal equaling –(0.5 LSB– Vtarget) in response to the analog calibration code equaling the lower limit.

Clause 4. The successive-approximation-register (SAR) analog-to-digital converter (ADC) system of any of clauses 2-3, wherein the controller is further configured to adjust the upper limit and the lower limit responsive to the residue offset of the corrected digital output signal.

Clause 5. The successive-approximation-register (SAR) analog-to-digital converter (ADC) system of clause 4, wherein the controller is further configured to adjust the upper limit and the lower limit responsive to an absolute value of the residue offset exceeding Vtarget.

Clause 6. The successive-approximation-register (SAR) analog-to-digital converter (ADC) system of any of clauses 3-5, wherein the controller is further configured to respond to the residue offset exceeding Vtarget while the analog calibration code equals the upper limit by switching the analog calibration code to equal the lower limit.

Clause 7. The successive-approximation-register (SAR) analog-to-digital converter (ADC) system of clause 6, wherein the controller is further configured to increment or decrement the digital calibration code by one LSB in response to the switching of the analog calibration code.

Clause 8. The successive-approximation-register (SAR) analog-to-digital converter (ADC) system of clause 7, wherein the SAR ADC is further configured to assert a timing bit in response to a change in the uncorrected digital output signal from the switching of the analog calibration code, and wherein the controller is further configured to increment or decrement the digital calibration code only after an assertion of the timing bit.

Clause 9. The successive-approximation-register (SAR) analog-to-digital converter (ADC) system of any of clauses 3-8, wherein the controller is further configured to respond to the residue offset being less than –Vtarget while the analog calibration code equals the lower limit by switching the analog calibration code to equal the upper limit.

Clause 10. The successive-approximation-register (SAR) analog-to-digital converter (ADC) system of clause 9, wherein the SAR ADC is further configured to assert a timing bit in response to a change in the uncorrected digital output signal from the switching of the analog calibration code, and wherein the controller is further configured to increment or decrement the digital calibration code in response to an assertion of the timing bit.

Clause 11. The successive-approximation-register (SAR) analog-to-digital converter (ADC) system of clause 10, wherein the controller is further configured to increment or decrement the digital calibration code by one LSB in response to the switching of the analog calibration code.

Clause 12. The successive-approximation-register (SAR) analog-to-digital converter (ADC) system of any of clauses 1-11, wherein the SAR ADC includes a comparator, and wherein the analog calibration circuit comprises at least one first variable capacitor coupled to a first output terminal of the comparator and comprises at least one second variable capacitor coupled to a second output terminal of the comparator.

Clause 13. A method of calibrating a DC offset of an uncorrected digital output signal of a SAR ADC, comprising:

adding a digital calibration code to the uncorrected digital output signal responsive to the DC offset of the uncorrected digital output signal to form a corrected digital output signal, wherein the digital calibration code equals an integer multiple of a least-significant bit (LSB) of the DC offset; and adjusting an analog calibration circuit in the SAR ADC to substantially eliminate a remaining fraction of the LSB of the DC offset.

Clause 14. The method of clause 13, wherein adjusting the analog calibration circuit is responsive to an analog calibration code, the method further comprising:

generating an analog calibration code to not exceed an upper limit and to not be less than a lower limit.

Clause 15. A serializer-deserializer receiver, comprising:

a continuous-time linear equalizer configured to process an input signal to produce a plurality of analog-to-digital converter (ADC) input signals;

a plurality of ADC slices corresponding to the plurality of ADC input signals, each ADC slice including a successive-approximation register (SAR) ADC system configured to digitize a corresponding one of the ADC input signals, wherein each SAR ADC system comprises:

a SAR ADC configured to convert an analog input signal into an uncorrected digital output signal having a DC offset, the SAR ADC including an analog calibration circuit responsive to an analog correction code;

a digital adder configured to add a digital calibration code to the uncorrected digital output signal to produce a corrected digital output signal; and a controller configured to generate the digital calibration code and to generate the analog calibration code responsive to the DC offset.

Clause 16. The serializer-deserializer receiver of clause 15, wherein the serializer-deserializer receiver comprises a pulse amplitude modulation 4-level (PAM4) serializer-deserializer receiver.

Clause 17. The serializer-deserializer receiver of any of clauses 15-16, wherein the controller is further configured to generate the digital calibration code without bit extension, and wherein the serializer-deserializer receiver is incorporated into a processor.

Clause 18. The serializer-deserializer receiver of any of clauses 15-17, further comprising:

a data combiner configured to combine the corrected digital output signal from each ADC slice to form an ADC digital output signal;

a digital signal processor configured to digitally equalize the ADC digital output signal to produce a serializer-deserializer output signal; and a clock-data recovery circuit configured to extract a clock signal from the ADC digital output signal.

Clause 19. The serializer-deserializer receiver of any of clauses 15-18, wherein each controller is further configured to adjust its analog calibration code to be within an upper limit and a lower limit.

Clause 20. The serializer-deserializer receiver of clause 19, wherein each analog calibration circuit is configured to produce an offset in its ADC slice's uncorrected digital output signal equaling a difference between one half of a least-significant bit (0.5 LSB) and a desired limit (Vtarget) for a residue offset of the ADC slice's corrected digital output signal in response to the analog calibration code equaling the upper limit, and wherein each analog calibration circuit is further configured to produce an offset in its ADC slice's uncorrected digital output signal equaling –(0.5 LSB–Vtarget) in response to the analog calibration code equaling the lower limit.

As those of some skill in this art will by now appreciate and depending on the particular application at hand, many modifications, substitutions and variations can be made in and to the materials, apparatus, configurations and methods of use of the devices of the present disclosure without departing from the scope thereof as defined by the appended claims. In light of this, the scope of the present disclosure should not be limited to that of the particular implementations illustrated and described herein, as they are merely by way of some examples thereof, but rather, should be fully commensurate with that of the claims appended hereafter and their functional equivalents.

What is claimed is:

1. A successive-approximation-register (SAR) analog-to-digital converter (ADC) system, comprising:

a SAR ADC configured to convert an analog input signal into an uncorrected digital output signal, the SAR ADC including an analog calibration circuit responsive to an analog calibration code;

a digital adder configured to add a digital calibration code to the uncorrected digital output signal to produce a corrected digital output signal; and a controller configured to adjust the digital calibration code and the analog calibration code responsive to a DC offset in the uncorrected digital output signal.

2. The successive-approximation-register (SAR) analog-to-digital converter (ADC) system of claim 1, wherein the controller is further configured to adjust the analog calibration code to not exceed an upper limit and to not be less than a lower limit.

3. The successive-approximation-register (SAR) analog-to-digital converter (ADC) system of claim 2, wherein the analog calibration circuit is configured to produce an offset in the uncorrected digital output signal equaling a difference between one half of a least-significant bit (0.5 LSB) and a desired limit (Vtarget) for a residue offset of the corrected digital output signal in response to the analog calibration code equaling the upper limit, and wherein to produce the analog calibration circuit is further configured to produce an offset in the uncorrected digital output signal equaling –(0.5 LSB–Vtarget) in response to the analog calibration code equaling the lower limit.

4. The successive-approximation-register (SAR) analog-to-digital converter (ADC) system of claim 3, wherein the controller is further configured to adjust the upper limit and (the lower limit responsive to the residue offset of the corrected digital output signal.

5. The successive-approximation-register (SAR) analog-to-digital converter (ADC) system of claim 4, wherein the controller is further configured to adjust the upper limit and the lower limit responsive to an absolute value of the residue offset exceeding Vtarget.

6. The successive-approximation-register (SAR) analog-to-digital converter (ADC) system of claim 3, wherein the controller is further configured to respond to the residue offset exceeding Vtarget while the analog calibration code equals the upper limit by switching the analog calibration code to equal the lower limit.

7. The successive-approximation-register (SAR) analog-to-digital converter (ADC) system of claim 6, wherein the controller is further configured to increment or decrement the digital calibration code by one LSB in response to the switching of the analog calibration code.

8. The successive-approximation-register (SAR) analog-to-digital converter (ADC) system of claim 7, wherein the SAR ADC is further configured to assert a timing bit in response to a change in the uncorrected digital output signal from the switching of the analog calibration code, and wherein the controller is further configured to increment or decrement the digital calibration code only after an assertion of the timing bit.

9. The successive-approximation-register (SAR) analog-to-digital converter (ADC) system of claim 3, wherein the controller is further configured to respond to the residue offset being less than-Vtarget while the analog calibration code equals the lower limit by switching the analog calibration code to equal the upper limit.

10. The successive-approximation-register (SAR) analog-to-digital converter (ADC) system of claim 9, wherein the SAR ADC is further configured to assert a timing bit in response to a change in the uncorrected digital output signal from the switching of the analog calibration code, and wherein the controller is further configured to increment or decrement the digital calibration code in response to an assertion of the timing bit.

11. The successive-approximation-register (SAR) analog-to-digital converter (ADC) system of claim 10, wherein the controller is further configured to increment or decrement the digital calibration code by only one LSB.

12. The successive-approximation-register (SAR) analog-to-digital converter (ADC) system of claim 1, wherein the SAR ADC includes a comparator, and wherein the analog calibration circuit comprises at least one first variable capacitor coupled to a first output terminal of the comparator and comprises at least one second variable capacitor coupled to a second output terminal of the comparator.

13. A method of calibrating a DC offset of an uncorrected digital output signal of a SAR ADC, comprising:

adding a digital calibration code to the uncorrected digital output signal responsive to the DC offset of the uncorrected digital output signal to form a corrected digital output signal, wherein the digital calibration code equals an integer multiple of a least-significant bit (LSB) of the DC offset; and adjusting an analog calibration circuit in the SAR ADC to substantially eliminate a remaining fraction of the LSB of the DC offset.

14. The method of claim 13, wherein adjusting the analog calibration circuit is responsive to an analog calibration code, the method further comprising:

generating the analog calibration code to not exceed an upper limit and to not be less than a lower limit.

15. A serializer-deserializer receiver, comprising:

a continuous-time linear equalizer configured to process an input signal to produce a plurality of analog-to-digital converter (ADC) input signals;

a plurality of ADC slices corresponding to the plurality of ADC input signals, each ADC slice including a successive-approximation register (SAR) ADC system configured to digitize a corresponding one of the ADC input signals, wherein each SAR ADC system comprises:

a SAR ADC configured to convert an analog input signal into an uncorrected digital output signal having a DC offset, the SAR ADC including an analog calibration circuit responsive to an analog calibration code;

a digital adder configured to add a digital calibration code to the uncorrected digital output signal to produce a corrected digital output signal; and a controller configured to generate the digital calibration code and to generate the analog calibration code responsive to the DC offset.

16. The serializer-deserializer receiver of claim 15, wherein the serializer-deserializer receiver comprise a pulse amplitude modulation 4-level (PAM4) serializer-deserializer receiver.

17. The serializer-deserializer receiver of claim 15, wherein the controller is further configured to generate the digital calibration code without bit extension, and wherein the serializer-deserializer receiver is incorporated into a processor.

18. The serializer-deserializer receiver of claim 15, further comprising:

a data combiner configured to combine the corrected digital output signal from each ADC slice to form an ADC digital output signal;

a digital signal processor configured to digitally equalize the ADC digital output signal to produce a serializer-deserializer output signal; and a clock-data recovery circuit configured to extract a clock signal from the ADC digital output signal.

19. The serializer-deserializer receiver of claim 15, wherein each controller is further configured to adjust its analog calibration code to be within an upper limit and a lower limit.

20. The serializer-deserializer receiver of claim 19, wherein each analog calibration circuit is configured to produce an offset in its ADC slice's uncorrected digital output signal equaling a difference between one half of a least-significant bit (0.5 LSB) and a desired limit (Vtarget) for a residue offset of the ADC slice's corrected digital output signal in response to the analog calibration code equaling the upper limit, and wherein each analog calibration circuit is further configured to produce an offset in its ADC slice's uncorrected digital output signal equaling −(0.5 LSB−Vtarget) in response to the analog calibration code equaling the lower limit.

* * * * *